United States Patent

Lepselter et al.

[15] 3,652,908

[45] Mar. 28, 1972

[54] FABRICATION OF INSULATED GATE FIELD-EFFECT TRANSISTORS INVOLVING ION IMPLANTATION

[72] Inventors: Martin P. Lepselter, New Providence; Alfred U. MacRae, Berkeley Heights, both of N.J.

[73] Assignee: Bell Telephone Laboratories, Incorporated, Murray Hill, N.J.

[22] Filed: Sept. 21, 1970

[21] Appl. No.: 73,719

Related U.S. Application Data

[62] Division of Ser. No. 796,404, Feb. 4, 1969, Pat. No. 3,590,471.

[52] U.S. Cl. ......................317/235, 317/235 UA, 317/235 B

[51] Int. Cl. ..........................................................H01l 11/14

[58] Field of Search.........................317/235 UA, 235 B, 235

[56] References Cited

UNITED STATES PATENTS

| | | | |
|---|---|---|---|
| 3,514,844 | 6/1970 | Bower | 29/571 |
| 3,534,235 | 10/1970 | Bower | 317/235 |
| 3,434,021 | 3/1969 | Hofstein | 317/235 |

OTHER PUBLICATIONS

Ames et al., I.B.M. Technical Disclosure Bulletin, Vol. 9, No. 10, March 1967, pgs. 1470–1471.

*Primary Examiner*—John W. Huckert
*Assistant Examiner*—Martin H. Edlow
*Attorney*—R. J. Guenther and Arthur J. Torsiglieri

[57] ABSTRACT

An insulated gate field-effect transistor is made which utilizes both Schottky barrier connections and ion-implanted zones. The resultant structure incorporates source and drain zones, which are formed by ion implantation and whose spacing is fixed by the gate electrode, and source and drain electrodes which make ohmic connection to the implanted source and drain zones and rectifying connections to unimplanted material.

3 Claims, 5 Drawing Figures

INVENTORS M. P. LEPSELTER
A. U. MAC RAE
BY Arthur J. Torsiglieri
ATTORNEY

FABRICATION OF INSULATED GATE FIELD-EFFECT TRANSISTORS INVOLVING ION IMPLANTATION

This is a division of U.S. application Ser. No. 796,404, filed Feb. 4, 1969, in the name of M. P. Lepselter and A. U. Mac Rae which issued on July 6, 1971 as U.S. Pat. No. 3,590,471.

1. Field of the Invention

This invention relates to insulated gate field-effect transistors.

2. Background of the Invention

One form of insulated gate field-effect transistor typically comprises a semiconductive layer which includes source and drain zones of like conductivity type which are separated by an intermediate region of the opposite conductivity type. Source and drain electrodes make ohmic connection to the respective source and drain zones and a gate electrode is deposited over the intermediate region but spaced from the semiconductor by an insulating layer. A voltage applied to the gate electrode is used to introduce into the intermediate region charge carriers of the type in the majority in the source and drain zones to permit current flow therebetween.

In the interest of high frequency response, it is desirable to keep the length of the intermediate region short and to keep the interelectrode capacitances small. To the latter end, it is important to minimize the overlap of the gate electrode with the source and drain zones.

In the interest of reliable manufacture, it is advantageous to avoid the use of high temperatures in the later steps of the fabrication process since these tend to cause deterioration of the insulating layer.

The present invention is directed to a structure which permits achieving an insulated gate field-effect transistor with good high frequency response in a reliable fashion.

SUMMARY OF THE INVENTION

In accordance with an illustrative embodiment of the invention, a genetic oxide layer is formed over one surface of an N-type silicon crystal and spaced source and drain contact holes are formed in the oxide layer. Platinum-silicide films are then deposited in the contact holes to form rectifying barrier contacts with the underlying N-type silicon. Metallic layers are then deposited over portions of the platinum-silicide films to form the source and drain electrodes and over a portion of the oxide layer overlying the region between the source and drain contact holes to form the gate electrode. Then the surface is irradiated with a beam of boron ions to implant such ions selectively in the wafer. In particular, the thicknesses of the various films and layers and the energies of the ions are such that ions in significant numbers do not penetrate the wafer in portions underlying the source, drain, and gate metallic electrodes but do penetrate in portions not masked by such electrodes. As a consequence there are formed in the wafer a pair of P-type zones spaced apart by the N-type region underlying the gate electrode. These two P-type zones make ohmic connection to the platinum silicide films in the source and drain contact holes and serve as the source and drain regions, respectively.

It is characteristic of this structure that permits a fabrication process that it avoids high temperature treatments subsequent to the formation of the oxide. There is reduced the need for critical mask alignments, the only really critical element being the gate electrode which is used as a mask in fixing the spacing between the source and drain regions. It can be appreciated that this permits close spacing of the source and drain zones together with relatively larger spacing of the source and drain electrodes. Moreover despite the simplification in the processing there is achieved the advantage of having discrete source and drain regions.

DESCRIPTION OF THE INVENTION

Figure 1A:
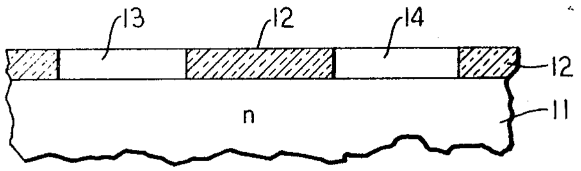
FIGS. 1A through 1D show a semiconductive wafer in various stages of its processing to incorporate therein an insulated gate field-effect transistor in accordance with an illustrative embodiment of the invention.

In the fabrication of an illustrative embodiment of the invention, a <100> oriented silicon crystal having a resistivity of about 1 ohm-centimeter is heated in an oxidizing atmosphere to form on one surface thereof a genetic silicon oxide layer of about 1,000 angstroms thickness and there is then opened in this layer spaced source and drain contact holes by photolithographic techniques. These steps may be of the kind which typically have been used in the fabrication of silicon insulated gate field-effect transistors. The resultant is shown in FIG. 1A with the upper surface of silicon wafer 11 being covered with an oxide insulating layer 12 provided with spaced source and drain contact openings 13 and 14.

Figure 1B:
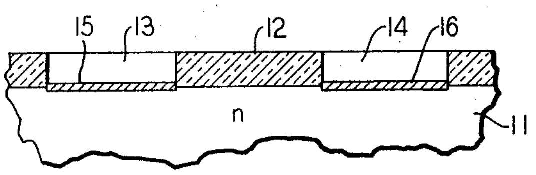

Thereafter, there is deposited within each of these openings a film of a material which forms a rectifying or Schottky barrier with the N-type silicon being contacted. Illustratively, this material is platinum silicide, which is a metallic substance which forms strong and intimate bond with silicon and which has a work function enduring a rectifying connection to N-type silicon and an ohmic connection to P-type silicon. Advantageously this film is formed by evaporating a layer of platinum 400 angstroms thick over the surface of the crystal and then heating to 600° C. for 5 minutes as a result of which the platinum in contact with the exposed silicon in the source and drain contact openings is sintered thereto to form platinum silicide while the platinum overlying the oxide does not adhere thereto and can thereafter be readily removed. In FIG. 1B platinum silicide films 15 and 16 are shown in source and drain contact holes 13 and 14, respectively, the oxide layer 12 being free of the platinum silicide.

Figure 1C:
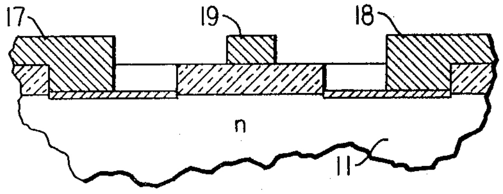

Next there are deposited the source, drain, and gate electrodes. The gate electrode is positioned to overlie the central portion of the oxide layer lying between the source and drain contact openings and the source and drain electrodes are positioned to overlie portions of the platinum silicide films, leaving uncovered portions of these films proximate the gate electrode as seen in FIG. 1C where electrodes 17, 18, and 19 are the source, drain, and gate electrodes, respectively. These electrodes advantageously comprise composite layers of titanium, platinum, and gold, the titanium being bottommost and serving to provide intimate contact with the oxide, the platinum being intermediate and serving primarily as a barrier between the gold and the silicon, and the gold being uppermost and serving to facilitate connection to these electrodes of suitable leads. Advantageously, the composite layer may be about one micron thick with the major part of the thickness being contributed by the gold. The manner of provision of electrodes of this kind is now well known and, for example, may be in the fashion described in U.S. Pat. Nos. 3,287,612 and 3,335,338 which issued to M. P. Lepselter on Nov. 22, 1966 and Aug. 8, 1967, respectively.

Figure 1D:
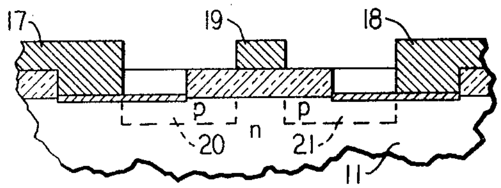

Next, the wafer is subjected to a beam of acceptor ions for ion implantation in known manner. The energy of the ions is adjusted to be such that none are able to penetrate the relatively impervious electrodes while a substantial number are able to penetrate the relatively permeable platinum silicide and oxide layers, as a result of which there are formed in the wafer boron-rich P-type zones 20 and 21 as seen in FIG. 1D which underlie the portion of the wafer extending between the source and drain electrodes except where covered by the gate electrode.

In one instance, the wafer was irradiated first with a beam of 150 kiloelectron volts energy and a total dose of $1.5 \times 10^{14}$ boron ions per square centimeter and then with a beam of 50 kiloelectron volts energy and total dose of $1.0 \times 10^{14}$ boron ions per square centimeters. Heating a wafer so treated at 350° C. for 30 minutes reduced the radiation damage produced by the ions and left P-type regions of about $10^{18}$ boron atoms per cubic centimeter about 4,000 angstroms deep. With such a doping, the contact between the platinum silicide films to the boron-rich regions is essentially ohmic. With respect to the unimplanted N-type regions, the contact will remain rectifying. As a consequence, the area of each of the source and drain electrodes to the semiconductor is determined effectively by the area of contact between the platinum silicide film and the contiguous P-type region, which area can be quite small. This in turn makes it possible to keep the interelectrode capacitances small and the high frequency response good.

In this same illustrative example, the source and drain contact openings are 50 microns wide, 200 microns long, and are spaced about 25 microns apart. The gate electrode is about 5 microns wide and 250 microns long and located centrally between the source and drain contact openings. The source and drain electrodes are such as to leave uncovered strips about 10 microns wide of the platinum silicide films so that the effective ohmic contact area of each of the source and drain connections is a strip 10 microns wide and 200 microns long.

Figure 2:
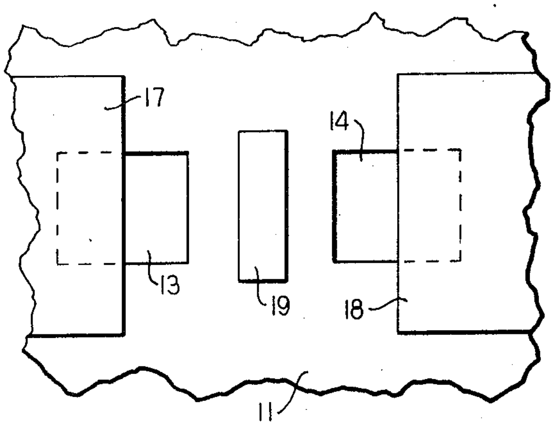
FIG. 2 shows a plan view of the end product of the process illustrated by FIGS. 1A through 1D.

FIG. 2 shows a plan view of the resultant transistor illustrating more clearly the disposition of the source, drain and gate electrodes, 17, 18, and 19, respectively, and the source and drain contact holes 13 and 14, respectively, which are covered with the platinum silicide films.

In many instances it will be desirable to form an array of such transistors in a single wafer with one sequence of steps and then to cut up the wafer into a number of dice each containing one or more such transistors.

In other instances, it will be advantageous to form one or more such field effect transistors in a localized portion of a wafer and to form additionally in other portions one or more other circuit components, such as resistors, capacitors, diodes or bipolar transistors which are interconnected with the field-effect transistors, preferably by way of metallic coatings of the type used to form electrodes 17, 18, and 19.

In some instances it may be advantageous to form an N-type epitaxial layer on a P-type substrate and thereafter to localize the field-effect transistor described in such epitaxial layer rather than in a crystal whose bulk is N-type.

In some instances, it may be preferable to form the complementary structure utilizing N-type source and drain regions spaced by a normally P-type region and this can be readily done by obvious modifications including the implantation of donors ions into initially P-type material and the use of an appropriate metal, such as zirconium, for forming rectifying barrier contacts to P-type material.

Similarly, it is feasible to utilize different materials for the insulation layer, particularly at the region underlying the gate electrode. For example, it is known to employ a composite silicon oxide and aluminum oxide layer to get a lower threshold. Silicon nitride has also proved useful for the gate insulation to minimize sodium contamination problems.

Similarly it is feasible to employ a variety of electrode materials and/or a variety of doping ions, and different semiconductors may be readily employed.

What is claimed is:

1. An insulated gate field-effect transistor comprising a semiconductive wafer having a surface layer which includes an intermediate portion of one conductivity type and spaced source and drain zones of the opposite conductivity type, an insulating layer overlying said surface layer and including openings overlying portions of the source and drain zones forming the source and drain openings, a gate electrode overlying part of the portion of the insulating layer extending between the source and drain openings, the width of the gate electrode being coextensive with the width of the intermediate portion of the one conductivity type extending between the source and drain zones, a separate layer of metallic material within each of the source and drain openings, each layer forming an ohmic contact with the source and drain zones, respectively, and a Schottky rectifying contact with the portion of the surface layer of one conductivity type which is contacted and which does not lie between the source and drain zones, a source electrode covering a limited portion of the layer of metallic material within the source opening, and a drain electrode covering a limited portion of the layer of metallic material within the drain opening.

2. An insulated gate field-effect transistor in accordance with claim 1 in which each of the layers of metallic material is coextensive with the associated source and drain openings.

3. An insulated gate field-effect transistor in accordance with claim 2 in which the wafer is silicon, the insulating layer is silicon oxide and the layers of metallic material are of platinum silicide.

* * * * *